(12) United States Patent
Hirose

(10) Patent No.: US 9,263,802 B2
(45) Date of Patent: Feb. 16, 2016

(54) ELECTROMAGNETIC WAVE ABSORBER

(71) Applicant: KABUSHIKI KAISHA RIKEN, Tokyo (JP)

(72) Inventor: Keita Hirose, Saitama (JP)

(73) Assignee: KABUSHIKI KAISHA RIKEN, Tokyo (JP)

(*) Notice: Subject to any disclaimer, the term of this patent is extended or adjusted under 35 U.S.C. 154(b) by 0 days.

(21) Appl. No.: 13/937,655

(22) Filed: Jul. 9, 2013

(65) Prior Publication Data

US 2014/0132440 A1 May 15, 2014

(30) Foreign Application Priority Data

Jul. 10, 2012 (JP) ................. 2012-155096

(51) Int. Cl.
*H01Q 17/00* (2006.01)
*H05K 9/00* (2006.01)

(52) U.S. Cl.
CPC ........... *H01Q 17/008* (2013.01); *H01Q 17/002* (2013.01); *H05K 9/0052* (2013.01)

(58) Field of Classification Search
CPC .................................................. H01Q 17/008
USPC ......................................................... 342/1–4
See application file for complete search history.

(56) References Cited

U.S. PATENT DOCUMENTS

| | | | | |
|---|---|---|---|---|
| 5,373,296 A * | 12/1994 | Ishino | ................... | G01R 29/105 342/1 |
| 6,373,425 B1 * | 4/2002 | Inoue | ..................... | H01Q 17/00 342/1 |
| 6,943,286 B1 * | 9/2005 | Kurihara | .............. | H05K 9/0075 174/390 |
| 7,695,803 B2 * | 4/2010 | Kasabo | .................. | B32B 29/08 206/719 |
| 2003/0146866 A1 * | 8/2003 | Hayashi | ............... | H01Q 17/008 342/1 |
| 2012/0126911 A1 * | 5/2012 | Romanko | ............ | H01Q 1/2225 333/24.2 |

FOREIGN PATENT DOCUMENTS

| | | |
|---|---|---|
| CN | 1729735 A | 2/2006 |
| EP | 0584011 A1 | 2/1994 |
| JP | 06-069676 A | 3/1994 |
| JP | 09-181475 A | 7/1997 |
| JP | 2000-188513 A | 7/2000 |
| JP | 2003-241761 A | 8/2003 |
| JP | 1470997 S | 6/2013 |

OTHER PUBLICATIONS

Chinese Office action for Application No. 201310288187.5 dated Jun. 4, 2014.
Chinese Office action for Application No. 201310288187.5 dated Sep. 12, 2014.
Extended European Search Report for Application No. 13175682.7 dated Feb. 17, 2015.

* cited by examiner

*Primary Examiner* — Jack W Keith
*Assistant Examiner* — Marcus Windrich
(74) *Attorney, Agent, or Firm* — Pearne & Gordon LLP

(57) ABSTRACT

An electromagnetic wave absorber includes a rectangular plate-shaped part having a surface including a flat space at a center of the plate-shaped part and a plurality of oblong rectangular spaces, surrounding the flat space, on each of which at least one pyramidal or wedge-shaped part having an oblong rectangular bottom face is provided, and the plurality of oblong rectangular spaces of the surface of the plate-shaped part are arranged along inside a perimeter of the plate-shaped part so that a longer side of any one of the plurality of oblong rectangular spaces is adjoining with a shorter side of another of the plurality of oblong rectangular spaces adjacent thereto while leaving the flat space at the center of the plate-shaped part.

2 Claims, 2 Drawing Sheets

(A)  (B)

(A)  (B)

(A)     (B)

ELECTROMAGNETIC WAVE ABSORBER

FIELD OF THE INVENTION

This invention relates to an electromagnetic wave absorber, more particularly a small-sized electromagnetic wave absorber having excellent absorbing performance for oblique incident angles as well as normal.

BACKGROUND OF THE INVENTION

The recent development of the advanced information society has raised the issue that weak electromagnetic radiation emitted from various types of communication equipment and electronic equipment causes malfunctions (electromagnetic interference (EMI)) in instruments and other components used in television sets and radios, communication equipment, medical equipment, ships, aircrafts, and so on, and there has been a need to establish international regulations on electromagnetic radiation emission. Accordingly, manufacturers of communication equipment of various types, personal computers, and the like generating noise that can cause EMI has been required to accurately measure the noise from their electronic components so as to take measures for EMI. That is, accurate measurement of very weak electromagnetic radiation from electronic equipment, etc. with a high performance instrument and measures to prevent emission of harmful electromagnetic radiation are being demanded. The problem encountered here is the environment in which electromagnetic radiation is measured. In order to accurately measure very weak electromagnetic radiation, a high performance anechoic chamber free from any extraneous disturbance such as noise is needed.

Electromagnetic radiation absorbers (hereinafter referred to as wave absorber(s) or simply absorber(s)) conventionally used in anechoic chambers are integrally molded structures having, as illustrated in FIG. 1, a plate-shaped part 1 and a polygonal pyramidal or wedge-shaped parts 2. These wave absorbers are dielectric loss structures made by expansion-molding an electromagnetic radiation absorbing material comprising a synthetic resin, such as polyurethane, polystyrene, or polypropylene, and an electrically conductive material, such as carbon. A hybrid wave absorber composed of a ferrite tile and the wave absorber of the dielectric loss type placed on the ferrite tile is known to exhibit good radiation absorption characteristics even with a reduced height of the dielectric loss structure because electromagnetic waves in a high frequency range of 100 MHz or higher are absorbed by the dielectric structure while electromagnetic waves in a low frequency range are absorbed by the ferrite tile, i.e., a magnetic absorber. With this hybrid wave absorber, there is provided an anechoic chamber of smaller size.

A number of proposals have been made with respect to polygonal pyramidal wave absorbers. For example, JP 2000-188513A discloses a wave absorber composed of a ferrite tile and an upper absorber having a wedge or pyramidal shape, the upper absorber being a molded part comprising a general purpose type resin having a relative permittivity of 4.9 or less at a frequency of 1 MHz or higher and ferrite powder dispersed in the resin. The wave absorber is described as being capable of absorbing higher frequency waves with the height of the upper absorber being equal to that of conventional wave absorbers. JP 2000-188513A also discloses a panel having four pyramidal parts the bottom of which are integrally connected to each other, the panel having a portion for screwing (e.g., a through-hole) at the center and on each of the four side edges thereof so that the absorber may be firmly fixed to construct an anechoic chamber with ease.

The structure of JP 2000-188513A shows excellent absorption characteristics for normal incidence of electromagnetic radiation. In practical electromagnetic radiation measurement, however, electromagnetic waves are incident on the ceiling and side walls of an anechoic chamber at a certain angle. For example, the angle of incidence is about 40° in a 10 m anechoic chamber. To meet the recent demand for a smaller-sized high-performance anechoic chamber, a wave absorber having absorption performance for oblique incidence as well as normal is required. The pyramidal shape of the absorber described in JP 2000-188513A has all the faces at the same angle of inclination, which is designed with weight put on normal incidence without due considerations given to oblique incidence characteristics.

In order to provide the structure of JP 2000-188513A with through-holes for screwing, adjacent pyramidal parts 2 must be arranged on the plate-shaped part 1 at a predetermined space, and a flat portion should be provided at the center of the panel as shown in FIG. 1. Such an arrangement of wave absorbers involves reduction of absorbing performance due to reflection on these flat portions, and the reduction of absorbing performance should be compensated for by, for example, increasing the height of the pyramidal parts 2.

SUMMARY OF THE INVENTION

An object of the invention is to provide an electromagnetic wave absorber excellent in absorption characteristics for oblique incidence as well as normal and suited for designing a small-sized and high-performance anechoic chamber.

As a result of extensive investigations, the present inventors have reached the invention based on their finding that a wave absorber that is small and yet exhibits not only excellent normal incidence characteristics but also improved oblique incidence characteristics is obtained by a configuration as follows:

An electromagnetic wave absorber comprising a rectangular plate-shaped part having a surface comprising a flat space at a center of the plate-shaped part and a plurality of oblong rectangular spaces, surrounding the flat space, on each of which at least one pyramidal or wedge-shaped part having an oblong rectangular bottom face is provided, wherein the plurality of oblong rectangular spaces of the surface of the plate-shaped part are arranged along inside a perimeter of the plate-shaped part so that a longer side of any one of the plurality of oblong rectangular spaces is adjoining with a shorter side of another of the plurality of oblong rectangular spaces adjacent thereto while leaving the flat space at the center of the plate-shaped part.

In case two or more pyramidal or wedge-shaped parts each having an oblong rectangular bottom face are provided on each of the oblong rectangular spaces, it is preferable that the two or more pyramidal or wedge-shaped parts are in contact with each other along the sides of their bottom faces with no flat portion in between.

In a preferable embodiment of the present invention, a wave absorber that is small and yet exhibits not only excellent normal incidence characteristics but also improved oblique incidence characteristics is obtained by arranging, on a rectangular plate-shaped part, a plurality of (e.g., four) oblong rectangular pyramidal or wedge-shaped parts along inside the perimeter of the plate-shaped part with a longer side of the rectangular bottom face of one pyramidal or wedge-shaped part adjoining with a shorter side of the rectangular bottom face of an adjacent pyramidal or wedge-shaped part while leaving a flat space at the center of the plate-shaped part. The preferable embodiment of the invention thus provides a wave absorber comprising a rectangular plate-shaped part and a plurality of (e.g., four) oblong rectangular pyramidal or wedge-shaped parts along inside the perimeter of the plate-shaped part with a longer side of the oblong rectangular bottom face of one pyramidal or wedge-shaped part adjoining with a shorter side of the oblong rectangular bottom face of an adjacent pyramidal or wedge-shaped part while leaving a flat space at the center of the plate-shaped part.

The wave absorber of the invention has a geometry in which a plurality of oblong rectangular spaces (a plurality of oblong rectangular pyramidal or wedge-shaped parts in case of the preferable embodiment) are arranged with a longer side of one oblong rectangular space (a longer side of the oblong rectangular bottom face of one pyramidal or wedge-shaped part in case of the preferable embodiment) adjoining with a shorter side of an adjacent oblong rectangular space (a shorter side of the oblong rectangular bottom face of an adjacent pyramidal or wedge-shaped part in case of the preferable embodiment) while leaving a flat space at the center of the plate-shaped part. Since the oblong rectangular spaces (the pyramidal or wedge-shaped parts in case of the preferable embodiment) are in contact with each other with no flat portion in between on which an electromagnetic wave might be reflected, the wave absorber achieves excellent wave absorbing performance even with a reduced size. Ease of constructing an anechoic chamber is maintained with this geometry because the central flat space may be used as a portion to fix a fastener and the like. Since the inclination angle of the faces of each rectangular pyramidal or wedge-shaped part differs between adjacent faces, the absorber exhibits improved absorbing performance for oblique incidence of electromagnetic waves.

DETAILED DESCRIPTION OF THE INVENTION

1: Plate-shaped part
2: Pyramidal part
4: Flat portion
5: Rectangular pyramidal (wedge-shaped) part

DETAILED DESCRIPTION OF THE INVENTION

Figure 1:
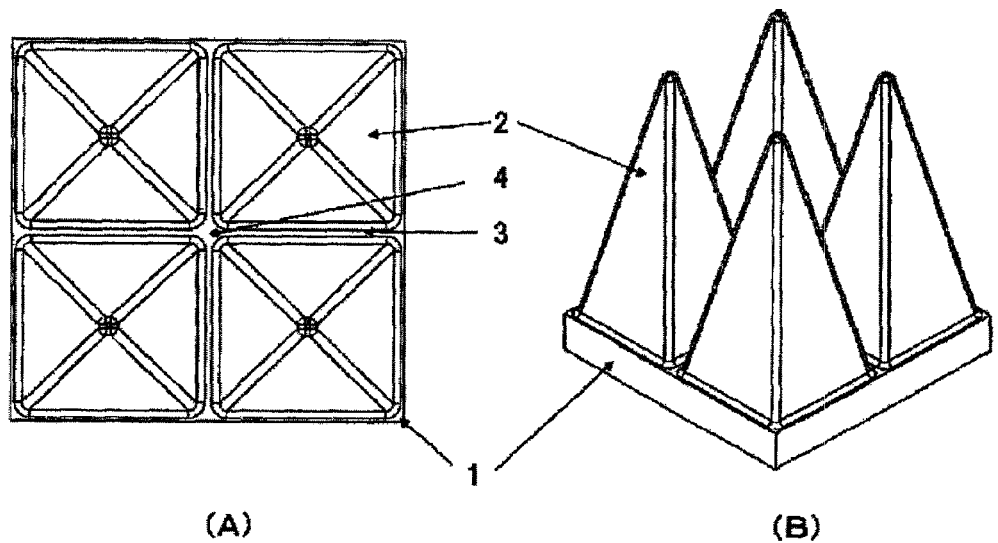
FIG. 1 shows the shape of a conventional wave absorber, in which the left image (A) is a top view, and the right image (B) is a perspective view.
Figure 2:
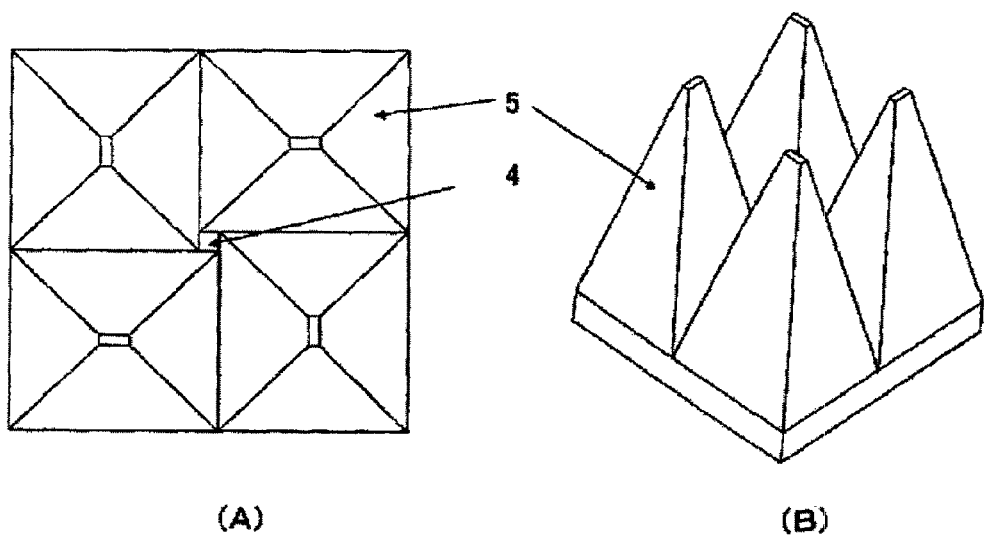
FIG. 2 represents an embodiment of the wave absorber according to the invention, in which the left image (A) is a top view, and the right image (B) is a perspective view.

An embodiment of the wave absorber of the invention is illustrated in FIG. 2, in which four molded parts 5 having an oblong rectangular pyramidal shape (or a wedge shape having an oblong rectangular bottom face) are arranged on a plate-shaped part 1 along inside the perimeter of the plate-shaped part 1 with a longer side of the oblong rectangular bottom face of one pyramidal part 5 adjoining with a shorter side of the oblong rectangular bottom face of an adjacent pyramidal part 5 while leaving a flat space 4 at the center of the plate-shaped part 1. According to this configuration, because flat spaces between adjacent pyramidal parts 5 is minimized while securing the flat space 4 for fixing an anchor fastener, reflection of electromagnetic waves on flat spaces is minimized to improve wave absorbing performance. In addition, since the inclination angles of the faces surrounding the flat space 4 are different between adjacent faces, the absorbing performance for oblique incidence of electromagnetic radiation are also improved. While the geometry of the rectangular pyramidal shape is not particularly limited, it is preferred that the aspect ratio (longer to shorter side ratio) of the rectangular bottom face be in the range of from 1.02 to 1.5. The aspect ratio within this range ensures the improvements on oblique and normal incidence characteristics. With an aspect ratio smaller than 1.02, ease of construction of an anechoic chamber may be reduced, and sufficient oblique incidence characteristics may not be obtained. When the aspect ratio exceeds 1.5, the central flat space 4 can cause the wave reflection problem. It is desirable that the fasteners that can be used in the invention be made of a low reflective material.

Figure 3:
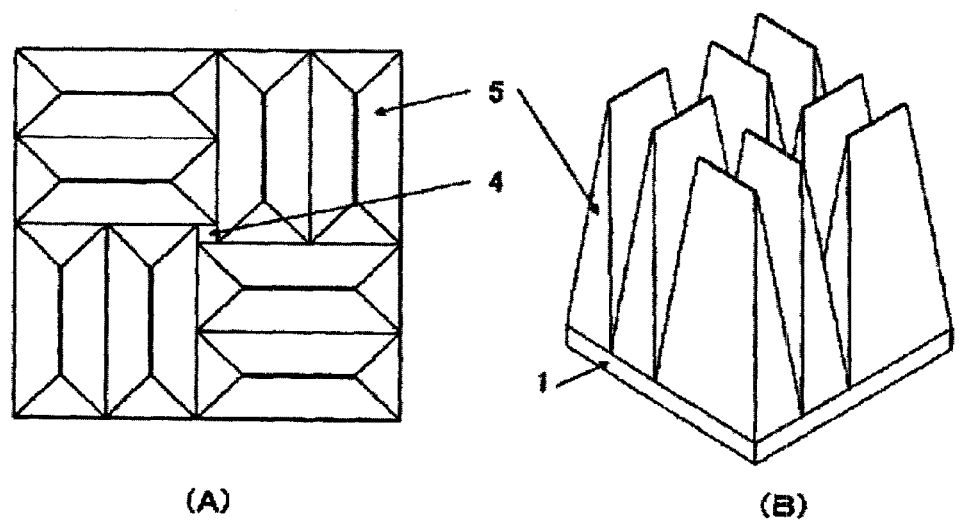
FIG. 3 represents another embodiment of the wave absorber according to the invention, in which two wedge-shaped parts each having an oblong rectangular bottom face are provided on each of the oblong rectangular spaces of the surface of the rectangular plate-shaped part, in which the left image (A) is a top view, and the right image (B) is a perspective view.

Another embodiment of the wave absorber of the invention is illustrated in FIG. 3. In this embodiment, each of the oblong rectangular pyramidal parts shown in FIG. 2 is longitudinally divided into two in a manner as to provide eight wedge-shaped parts, the bottom face of which has an increased aspect ratio, arranged on the plate-shaped part 1. According to this configuration, the volume proportion of the absorber per unit spatial volume increases as compared with the configuration of FIG. 2, and, as a result, the wave absorption characteristics in a relatively low frequency range of from 1 GHz to ten or so gigahertz are improved. Furthermore, because the arrangement of the wedge-shaped parts constituting the absorber is denser than in FIG. 2, the absorption performance for electromagnetic waves of short wavelengths (frequencies of 20 GHz or higher) is improved.

The wave absorber according to the invention is configured such that a plurality of, basically four, oblong rectangular pyramidal (or wedge-shaped) parts 5 with an oblong rectangular bottom face are arranged on the plate-shaped part 1 while leaving a flat square space 4 in the center of the part 1. As long as the aspect ratio of the bottom face of the unit rectangular pyramid fall within the above recited range, the manner of dividing the unit rectangular pyramid is not limited to that shown in FIG. 3. That is, the unit rectangular pyramid may be divided into more than two rectangular pyramids and may be divided along the longitudinal direction of the bottom face or a direction perpendicular to the longitudinal direction.

While the height of the wave absorber of the invention is not particularly limited, the invention is preferably applied to small-sized wave absorbers with a height of 200 mm or less.

The oblong rectangular pyramidal parts used in the invention may be molded from any known electromagnetic radiation absorbing material. The invention is applicable to wave absorbers made of either of a dielectric loss material and a magnetic loss material. The wave absorber may be of hybrid type composed of a plate-shaped part made of a magnetic absorbing material, such as a ferrite tile, and oblong rectangular pyramidal parts made of a dielectric loss material, or both the plate-shaped part and the rectangular pyramidal parts may be made of the same material.

Examples of useful dielectric loss materials include resinous materials, such as carbon-containing foamed polyurethane, carbon-containing foamed polystyrene, and carbon-containing foamed polypropylene; and inorganic materials (e.g., cement, alumina, zirconia, and silica) having carbon dispersed therein. These materials may be molded into either solid or hollow shapes. Otherwise, plate-shaped molded pieces made of a resin material, an inorganic material (e.g., alumina, zirconia, or silica), paper, or a like material each containing carbon or coated with a carbon layer may be assembled to form a hollow oblong rectangular pyramid. Examples of the carbon material include graphite, carbon black, and carbon nanotubes.

Examples of commonly used magnetic loss materials include ferrite powder-containing resins and ferrite powder-containing inorganic materials, which are molded into either solid or hollow parts. A hollow oblong rectangular pyramid may be formed by assembling plate-shaped molded pieces made of a resin material, an inorganic material, such as alumina, zirconia, or silica, paper, or a like material each containing ferrite powder or coated with a ferrite layer. Examples of the ferrite powder include spinel ferrites, such as Ni—Zn ferrite, Li—Zn ferrite, and Mn—Zn ferrite.

Preferred of the electromagnetic radiation absorbing materials recited is a material mainly containing cement and carbon nanotubes. When a material of this kind is used, the wave absorber is usually produced by mixing carbon nanotubes and a dispersing medium, such as water, into a cement raw material, followed by stirring to prepare a slurry, casting the resulting cement slurry into a mold, curing the cement for a prescribed time under controlled temperature and humidity in accordance with the curing conditions of the cement to harden the cement, and removing the hardened block from the mold. Since the sintering step as is needed for ceramic materials is omitted, the problems associated with sintering, such as dimensional variations due to shrinkage and combustion of carbon nanotubes, are not involved, and there is obtained an incombustible and power-durable wave absorber. Furthermore, the wave absorber made from this material exhibits excellent electrical conduction characteristics even with a reduced amount of carbon based on the ionic conduction by the ions present in the water in voids of the cement matrix and electrically conductive paths formed by wave absorbing carbon nanotubes. In the absorber made from this material, there are electrically conductive paths that are electrically insulated from one another and each formed of a plurality of carbon nanotubes thereby to provide a resistor/capacitor (condenser) mixed structure exhibiting excellent dielectric characteristics based on resistance loss and dielectric loss. Therefore, the absorber achieves excellent radiation absorption characteristics even with a small size in the frequency range of from several to several tens of gigahertz where dielectric characteristics are dominant and in the frequency range of from several tens to several hundreds of gigahertz where electrical conduction characteristics are dominant.

EXAMPLES

The invention will now be illustrated in more detail with reference to Examples, it being understood that the following description is illustrative and not restrictive of the scope of the invention.

Example 1

Thirty parts (by weight, hereinafter the same) of water and 2.0 parts (2.0% by weight relative to the total weight of the wave absorber obtained) of carbon nanotubes having a length of 5 μm were added to 100 parts of portland cement, followed by kneading along with a dispersant to prepare a slurry. The slurry was cast in a mold and hardened at room temperature to give a molded block (wave absorber) having the shape illustrated in FIG. 2 in which four rectangular pyramids each measuring 52.5 mm by 47.5 mm along the bottom face with a height of 180 mm were arranged on a plate measuring 100 mm×100 mm×15 mm (thickness) with a longer side of the rectangular bottom face of one pyramid adjoining with a shorter side of the rectangular bottom face of an adjacent pyramid while leaving a flat space measuring 5 mm by 5 mm at the center of the plate. A total of 36 wave absorbers were made in that way and arrayed in a grid extending 600 mm by 600 mm. The electromagnetic wave absorbing performance of the array of the absorbers was evaluated for normal incidence and oblique incidence by the method described infra. The results obtained are shown in Table 1.

Comparative Example 1

A wave absorber was made using the same material and the same method as in Example 1, except for the geometry and arrangement of the pyramids. That is, four square pyramids measuring 45 mm along each side of the bottom face and 180 mm in height were placed 2.5 mm inside from the four sides of the plate (100 mm×100 mm×15 mm (thickness)) with a gap (flat space) of 5 mm between adjacent pyramids. A total of 36 wave absorbers were made in that way and arrayed in a grid extending 600 mm by 600 mm. The electromagnetic wave absorbing performance of the array of the absorbers was evaluated for normal incidence by the same method as used in Example 1. The results are shown in Table 1.

Comparative Example 2

A wave absorber was made using the same material and the same method as in Comparative Example 1, except that four square pyramids measuring 50 mm along each side of the bottom face and 180 mm in height were arranged on the plate with no space therebetween. A total of 36 wave absorbers were made in that way and arrayed in a grid extending 600 mm by 600 mm. The electromagnetic wave absorbing performance of the array of the absorbers was evaluated for oblique incidence by the same method as used in Example 1. The results are shown in Table 1. Evaluation of Electromagnetic Wave Absorption Characteristics:

In evaluating the electromagnetic wave absorption characteristics for normal incidence (incident angle=0°), electromagnetic radiation emitted from a horn antenna was collimated into plane waves by a dielectric lens so as to be directed perpendicularly to the absorbers. In evaluating the absorption characteristics for oblique incident angles, electromagnetic radiation emitted from a horn antenna was collimated into plane waves by a dielectric lens in the same manner as for the evaluation of normal incidence characteristics, and the plane waves were directed to the absorbers at an angle of incidence of 15°, 30°, and 45°. The measuring frequency range was from 1 to 110 GHz.

It is seen from Table 1 that the wave absorber of Example 1 exhibits excellent radiation absorption characteristics in the entire measuring frequency range of 1 to 110 GHz for normal incidence (incident angle=0°), especially in a high frequency range. In contrast, the absorber of Comparative Example 1 having the pyramidal parts arranged with a gap therebetween proved inferior to that of Example 1 in radiation absorption characteristics for normal incidence in the entire measuring frequency range and, in particular, failed to achieve sufficient absorption characteristics in the frequency range of 5 GHz or lower. This is believed to be due to the refection of electromagnetic waves on the flat portions (gaps) between the pyramidal parts.

The absorber of Example 1 also proved superior to that of Comparative Example 2 having the pyramidal parts arranged on the plate with no gap therebetween in electromagnetic radiation absorbing performance at every angle of incidence at every measuring frequency.

These results verify that the invention provides a small-sized electromagnetic wave absorber excellent in normal and oblique incidence characteristics while maintaining ease of construction of an anechoic chamber.

TABLE 1

| | Incident Angle (°) | Electromagnetic Wave Absorption Characteristics (dB) | | | | | | | | | |
|---|---|---|---|---|---|---|---|---|---|---|---|
| | | 1 GHz | 3 GHz | 5 GHz | 10 GHz | 20 GHz | 40 GHz | 60 GHz | 80 GHz | 100 GHz | 110 GHz |
| Example 1 | 0 | 25 | 30 | 30 | 35 | 40 | 45 | 50 | 50 | 50 | 50 |
| | 15 | 23 | 28 | 28 | 32 | 35 | 40 | 46 | 50 | 50 | 50 |
| | 30 | 21 | 25 | 27 | 30 | 33 | 36 | 40 | 45 | 50 | 50 |
| | 45 | 20 | 23 | 25 | 28 | 32 | 34 | 37 | 43 | 48 | 50 |
| Compara. Example 1 | 0 | 15 | 15 | 18 | 20 | 20 | 25 | 25 | 25 | 30 | 30 |
| Compara. Example 2 | 15 | 21 | 25 | 26 | 28 | 32 | 36 | 41 | 44 | 48 | 50 |
| | 30 | 18 | 22 | 22 | 24 | 27 | 30 | 33 | 37 | 42 | 45 |
| | 45 | 16 | 19 | 20 | 21 | 23 | 25 | 28 | 32 | 36 | 40 |

What is claimed is:

1. A wave absorber comprising a quadrangular plate-shaped part, and a plurality of rectangular pyramidal parts disposed on the quadrangular plate-shaped part, wherein each of the plurality of rectangular pyramidal parts has a rectangular base arranged along an outer perimeter of the plate-shaped part with a longer side of the rectangular base of any one of the pyramidal parts partially contacting with a shorter side of the rectangular base of another pyramidal part adjacent thereto while leaving a flat space at the center of the plate-shaped part, wherein each of the contacting portions of the longer sides extend from the outer perimeter of the plate-shaped part to each corner of the flat space and the non-contacting portions of the longer sides surround the flat space, wherein the flat space is provided only at the center of the plate-shaped part, wherein each of the plurality of rectangular pyramidal parts is molded from an electromagnetic radiation absorbing material and wherein a ratio of a length of a longer side to a length of a shorter side of the rectangular pyramidal parts, a length of a longer side/a length of a shorter side, is within a range of 1.02 to 1.5.

2. The wave absorber according to claim 1, wherein the plate-shaped part is occupied only by the flat space at the center of the plate-shaped part and the rectangular pyramidal parts are divided into four portions each having substantially a same shape.

* * * * *